(12) United States Patent
Prestage et al.

(10) Patent No.: US 8,058,936 B2
(45) Date of Patent: Nov. 15, 2011

(54) ATOMIC ION CLOCK WITH TWO ION TRAPS, AND METHOD TO TRANSFER IONS

(75) Inventors: John D. Prestage, Pasadena, CA (US); Sang K. Chung, La Verne, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 12/201,848

(22) Filed: Aug. 29, 2008

(65) Prior Publication Data

US 2009/0058545 A1    Mar. 5, 2009

Related U.S. Application Data

(60) Provisional application No. 60/967,090, filed on Aug. 31, 2007.

(51) Int. Cl.
*H03L 7/26* (2006.01)
(52) U.S. Cl. .............................. 331/94.1; 331/3; 324/304
(58) Field of Classification Search ................. 331/94.1, 331/3; 250/281; 324/304
See application file for complete search history.

(56) References Cited

U.S. PATENT DOCUMENTS

| 5,248,883 | A | * | 9/1993 | Brewer et al. | 250/292 |
| 5,379,000 | A | * | 1/1995 | Brewer et al. | 331/3 |
| 5,420,549 | A |   | 5/1995 | Prestage | |
| 6,906,324 | B1 | * | 6/2005 | Wang et al. | 250/292 |

OTHER PUBLICATIONS

Prestage, J. et al., "Atomic clocks and variations of the fine structure constant," Physical Review Letters, vol. 74, No. 18, May 1, 1995, pp. 3511-3514.
Prestage, J. et al., "Atomic clocks and oscillators for deep-space navigation and radio science," Proceedings of the IEEE, vol. 95, No. 11, Nov. 2007, pp. 2235-2247.
Prestage, J. et al., "Progress on small mercury ion clock for space applications," IEEE, 2009, pp. 54-57. Dec. 2009.
Prestage, J. et al., "New ion trap for frequency standard applications," J. Appl. Phys. 66 (3), Aug. 1, 1989, pp. 1013-1017.
Prestage, J. et al., "Precision clocks in space and a-variations," Nuclear Physics B (Proc. Suppl.) 134 (2004), pp. 163-170. Dec. 2004.
Prestage, J. et al., "Stability measurements between Hg+ lite 12-pole clocks," 2002 IEEE International Frequency Control Symposium and PDA Exhibition, 2002, pp. 459-462. Dec. 2002.
Prestage, J. et al., "Recent Developments in Microwave Ion Clocks", Topics in Applied Physics, vol. 79/2001, pp. 195-211 (2001). Dec. 2001.

* cited by examiner

*Primary Examiner* — Joseph Chang
(74) *Attorney, Agent, or Firm* — Gates & Cooper LLP

(57) ABSTRACT

An atomic ion clock with a first ion trap and a second ion trap, where the second ion trap is of higher order than the first ion trap. In one embodiment, ions may be shuttled back and forth from one ion trap to the other by application of voltage ramps to the electrodes in the ion traps, where microwave interrogation takes place when the ions are in the second ion trap, and fluorescence is induced and measured when the ions are in the first ion trap. In one embodiment, the RF voltages applied to the second ion trap to contain the ions are at a higher frequency than that applied to the first ion trap. Other embodiments are described and claimed.

23 Claims, 5 Drawing Sheets

ATOMIC ION CLOCK WITH TWO ION TRAPS, AND METHOD TO TRANSFER IONS

PRIORITY CLAIM

This application claims the benefit of U.S. Provisional Application No. 60/967,090, filed 31 Aug. 2008.

GOVERNMENT INTEREST

The invention claimed herein was made in the performance of work under a NASA contract, and is subject to the provisions of Public Law 96-517 (35 USC 202) in which the Contractor has elected to retain title.

FIELD

The present invention relates to atomic clocks, and more particularly, to atomic ion clocks.

BACKGROUND

Ultra-stable atomic clocks find widespread applications in navigation, communications, and scientific measurements and experiments, to name just a few. An atomic clock comprises a gas cell or vacuum tube to confine an ensemble of reference atomic oscillators, isolated from changes in the environment where the clock operates. In many instances, an atomic clock comprises a quartz oscillator, where the frequency of the quartz oscillator is corrected and accurately maintained by exploiting the physics of the reference atomic oscillators. Sampling the output of the quartz oscillator at specific oscillation intervals provides the ticks of the atomic clock.

One type of atomic clock is an atomic ion clock where the two lowest energy levels of the ions determine the frequency of the "atomic oscillators". The ions are confined within an ion trap by the use of radiofrequency (RF) and static (DC) electric fields. For the two lowest energy levels with an energy difference of $\Delta E$, the frequency $\omega$ associated with the ion atomic oscillators is given by $\Delta E = \hbar \omega$, where $\hbar$ is Planck's constant.

Mercury (Hg) ion atomic clocks offer some advantages over other high-performance clocks being developed today. FIG. 1 illustrates the two lowest energy levels (split from the $^2S_{1/2}$ energy level) for $^{199}$Hg+ ions, labeled 102 and 104, sometimes referred to as the upper clock level and the lower clock level, respectively. A $^{202}$Hg discharge lamp may be used to provide ultraviolet light with wavelength 194 nm, so that an ion may be excited from upper clock level 102 to $^2P_{1/2}$ optically excited state 106. This is pictorially represented by photon absorption line 108, showing that the energy difference between energy levels 106 and 102 corresponds to the energy of a photon with a wavelength of 194 nm. When an ion is in optically excited state 106, it may then transition to lower clock level 104, as pictorially represented by photon emission line 110, emitting a photon at a wavelength smaller than 194 nm. In this way, with ions initially populating energy level 102, fluorescence is observed because the absorption of 194 nm light leads to the emission of light at a lower wavelength (higher frequency).

Once ions are driven into lower clock level 104, they no longer absorb and scatter the 194 nm photons. Fluorescence will resume when an interrogating microwave radiation is tuned to the approximately 40.507 GHz transition between energy levels 102 and 104, thereby leading to a repopulation of ions to upper clock level 102. The fluorescence response peaks when the microwave radiation is at approximately 40.507 GHz, and will decrease as the microwave frequency is tuned away from 40.507 GHz. FIG. 2 illustrates a sample data fluorescence response curve, giving photon count as a function of frequency offset from the center frequency (approximately 40.507 GHz) of the interrogating microwave radiation.

Rather than look directly for a peak fluorescence response, some atomic clocks will modulate the interrogating microwave radiation at two frequencies $\nu_0 + \Delta\nu$ and $\nu_0 - \Delta\nu$, and will vary $\nu_0$ until the fluorescence response at frequency $\nu_0 + \Delta\nu$ is substantially equal to the fluorescence response at frequency $\nu_0 - \Delta\nu$. When this occurs, the two frequencies are essentially centered about the peak fluorescence response frequency, so that $\nu_0$ is essentially the peak response frequency and is a measure of the frequency transition between upper and lower clock levels 102 and 104.

The above description of a mercury atomic ion clock may be represented at the system level by FIG. 3, illustrating ion trap 302, with optical windows 304 and 306, and microwave window 308. The source of optical radiation is labeled 310, and optical detector 312 measures the fluorescence. Oscillator 314 provides a reference frequency, which is modulated by modulator 316 to $\nu_0 + \Delta\nu$ and $\nu_0 - \Delta\nu$, and microwave radiator 318 interrogates the ions in ion trap 302 via microwave window 308. These component systems are monitored and controlled by control system 320, so that the frequency of oscillator 314 is controlled to provide equal fluorescence responses at the two frequencies $\nu_0 + \Delta\nu$ and $\nu_0 - \Delta\nu$. The output of oscillator 314 provides a stable frequency reference to be used as the basis for an atomic clock. (A clock will count the cycles, and add one second after an appropriate number of cycles have been accumulated.)

The atomic clock system of FIG. 3 is operated in two phases, a first phase in which lamp 310 optically stimulates the ions so that optical detector 312 may detect fluorescence, but where microwave radiator 318 is off; and a second phase, where lamp 310 is off and the microwave radiator 318 is on so that upper clock level 102 may be repopulated.

U.S. Pat. No. 5,420,549, hereinafter referred to as the '549 patent, discloses a mercury ion atomic clock in which a linear quadruple ion trap is electrically separated into two regions. The regions are co-linear, have the same number of electrodes, and are driven by the same RF field to contain the ions; but separate DC voltages are applied to each region to shuttle the ions from one region to the other. Fluorescence is stimulated only when the ions are in the first ion trap, whereas the resonance interrogating microwave radiation is applied only when the ions are in the second ion trap region. As explained in the '549 patent, by separating the ion trap into two regions, a resonance region and a fluorescence region, the resonance region may be made much smaller than the fluorescence region, making it easier to magnetically shield the resonance region, as well as simplifying thermal control. Other advantages are described in the '549 patent.

DESCRIPTION OF EMBODIMENTS

Described herein is an atomic ion clock embodiment, with improvements over the embodiments described in the '549 patent. In the description that follows, the scope of the term "some embodiments" is not to be so limited as to mean more than one embodiment, but rather, the scope may include one embodiment, more than one embodiment, or perhaps all embodiments.

Figure 1:
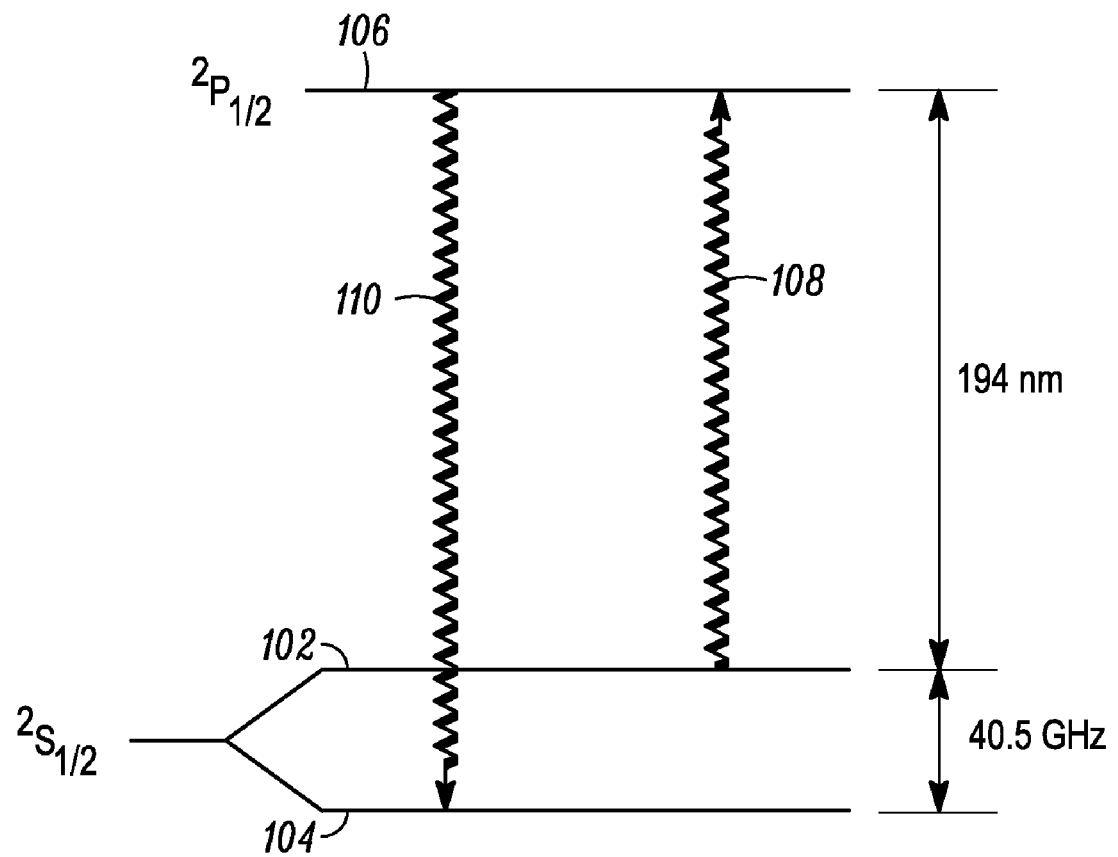
FIG. 1 illustrates energy level transitions for mercury ions.
Figure 2:
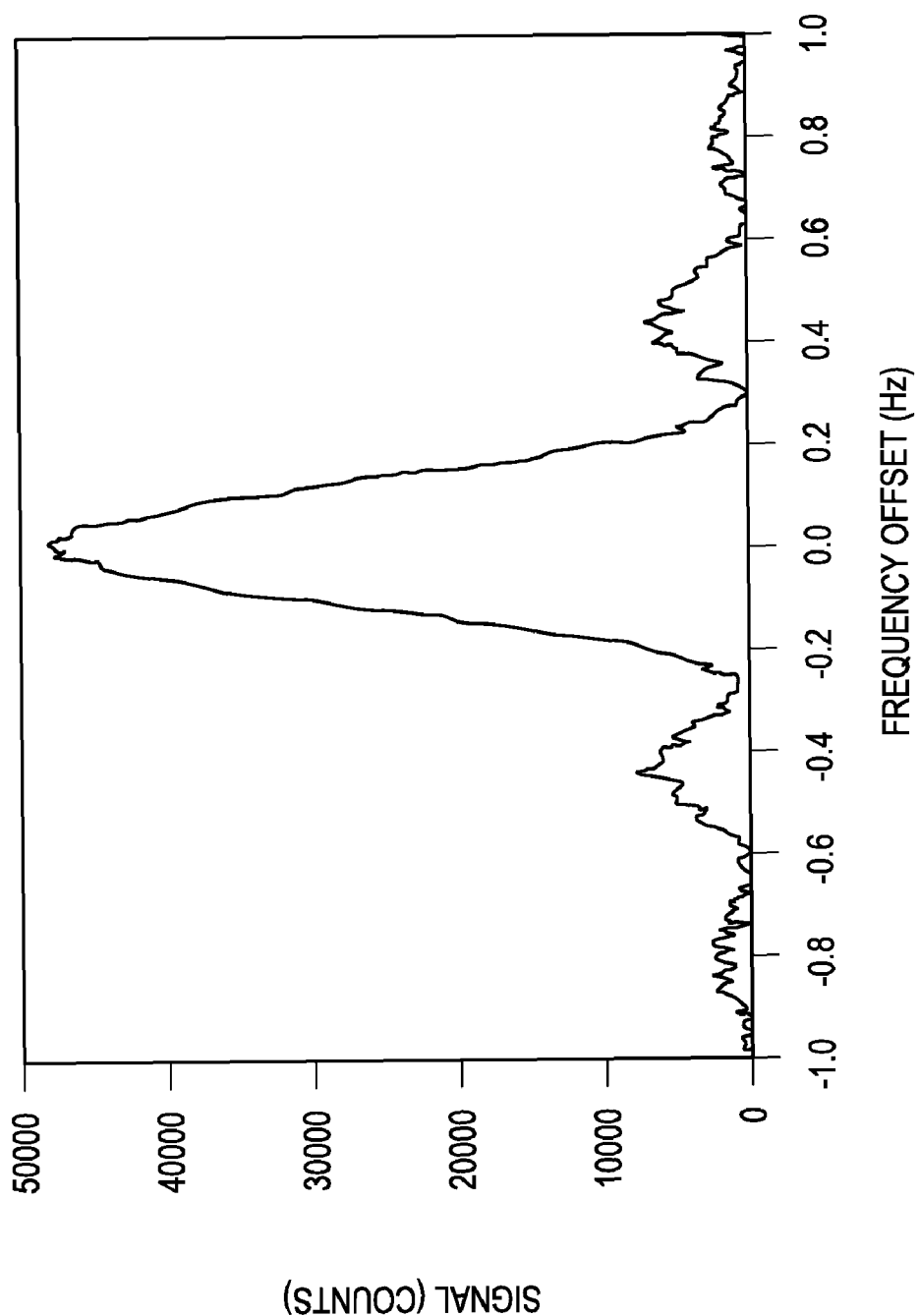
FIG. 2 illustrates a fluorescence response curve for mercury ions.
Figure 3:
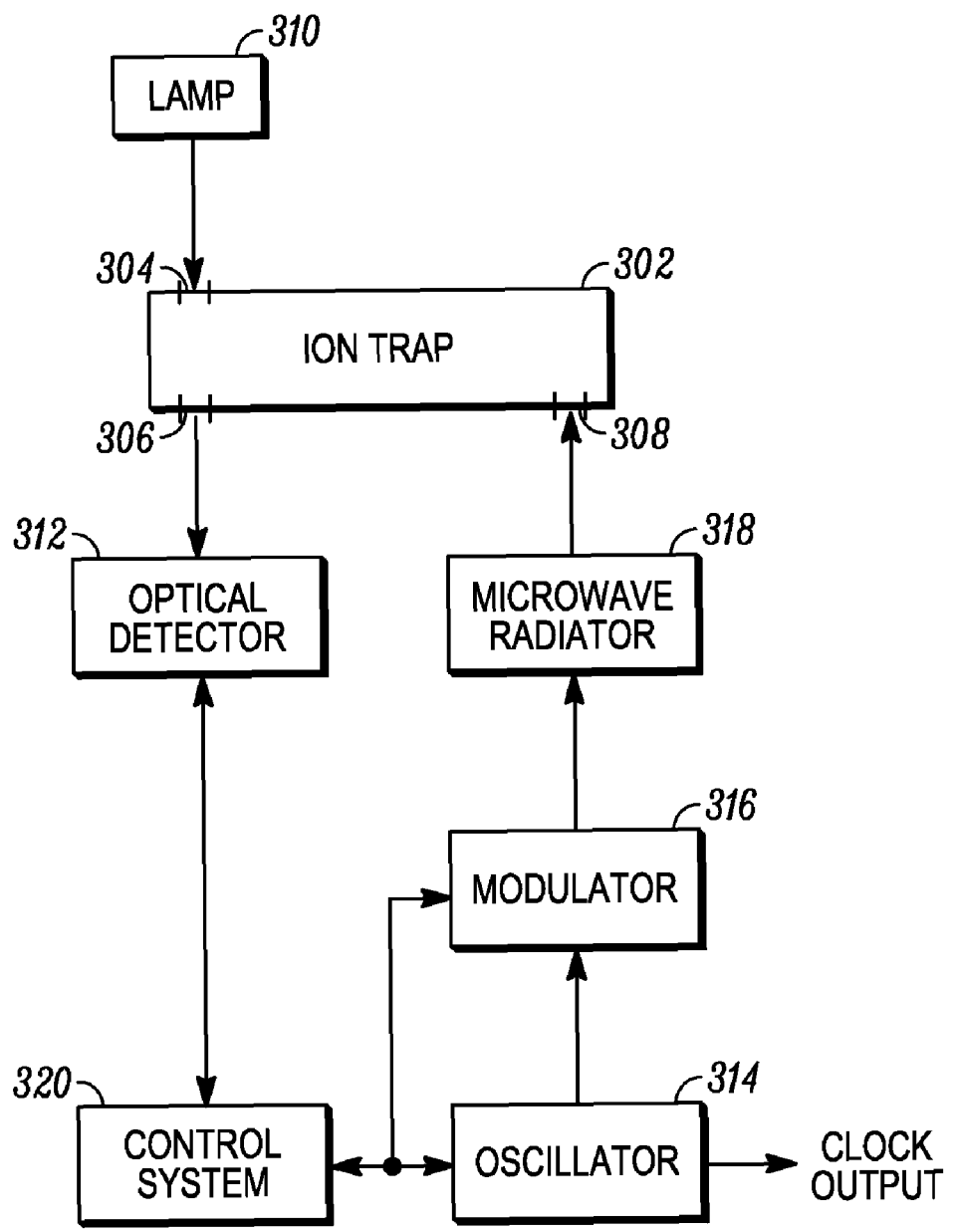
FIG. 3 illustrates a prior art atomic clock at the system level.
Figure 4:
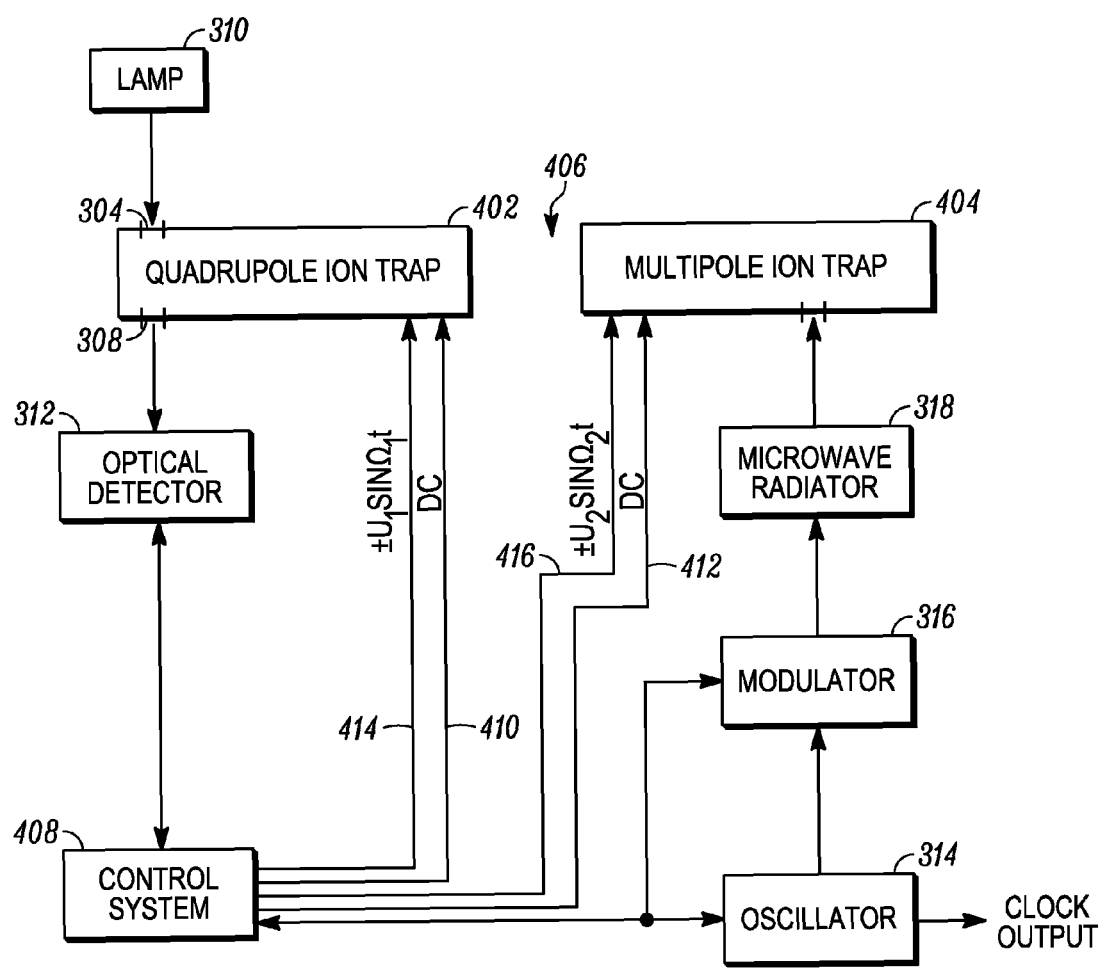
FIG. 4 illustrates, at the system level, an atomic clock according to an embodiment.

FIG. 4 illustrates an atomic ion clock at the system level according to an embodiment. The embodiment comprises two ion traps: quadrupole ion trap 402 and multipole ion trap 404. Multipole ion trap 404 may be a quadrupole ion trap, but in general it is expected to have more poles (electrodes) than a quadrupole. For example, for some embodiments, multipole ion trap 404 may be a 16-pole ion trap (e.g., 16 electrodes). These ion traps are electrically isolated from each other. This isolation is pictorially represented by gap 406. The system components in FIG. 4, except for control system 408, are labeled with the same numerals as their corresponding system components in FIG. 3. The ions may be $^{199}$Hg+ ions, but embodiments are not necessarily limited to mercury ions.

Increasing the pole order of an ion trap used for microwave clock interrogations leads to less RF ion motion in the trapping fields than experienced in a quadrupole trap. RF trapping forces are generated by ion "micro-motion" in the spatial gradient of the trapping fields, known as the pondermotive force. This force should overcome the space-charge forces of a large cloud of ions, usually much larger than the thermal motion of ions at room temperature.

Ion micro-motion leads directly to a special relativistic time dilation ($2^{nd}$-order Doppler shift) shift of the clock resonance frequency of the moving $^{199}$Hg$^{+}$ ions, denoted by the fractional frequency shift $\Delta f/f$, which is given by $$\frac{\Delta f}{f} = -\frac{1}{(k-1)} \frac{q^2}{8\pi\varepsilon_0 \ \mathrm{mc}^2} \frac{N}{L}.$$

This expression is seen to be proportional to the linear number density N/L, where N is the total ion number and L is the ion trap length. In this expression, q is the elementary charge, $mc^2$ is the Hg ion rest mass energy, and $\varepsilon_0$ is the permittivity of free space. This equation is derived from the Boltzmann equation describing the ion plasma inside the multipole trap and applies to a linear multipole trap with 2k electrodes and assumes a cold cloud with negligible thermal ion energy. A similar 1/(k−1) suppression of frequency-pulling exists for the low space charge or single particle limit where only thermal motion is present. That is, for higher pole traps the motion driven by the trapping field is reduced by the 1/(k−1) factor.

A 16-pole trap reduces second-order Doppler frequency pulling seven-fold compared to a linear quadrupole trap. Because the multipole trap is typically longer than quadrupole traps used for frequency standards, another reduction in $2^{nd}$-order Doppler shift is gained because the linear ion density N/L is reduced.

Long term variations in ion number that lead to frequency changes in clock output are greatly reduced by the use of a multipole trap for ion clock resonance interrogations.

Ion shuttling between ion traps 402 and 404 allows separation of the state selection process from the clock microwave resonance process so that each trap may be independently optimized for its task. This separation of functions has proven to be a powerful tool with ions because the beam of ions may be reversed in direction, halted, and transported from one trap to the other with an insignificant loss of atoms.

For the embodiment of FIG. 4, quadrupole linear ion trap 402 tightly confines ions for optical state selection, whereas for multipole ion trap 404 the ions are more loosely confined and the microwave atomic transitions are executed. A DC voltage ramp is applied to control the ion shuttling between quadrupole ion trap 402 and the more weakly confining multipole ion trap 404. In quadrupole ion trap 402, the ion cloud is squeezed to a relatively small radius for efficient optical state selection, and space-charge interaction within the ion cloud may be stronger than thermal energies. In this particular embodiment, space charge interaction energy is also larger than the well depth for ions in multipole ion trap 404, and a restriction on the slew rate of the voltage ramping waveform then results. The voltage ramping used to move ions from one trap to the other should proceed slowly to allow for ion thermalization with a buffer gas (typically neon or helium). This typically requires a ramp voltage change of state to be more than 100 ms and as much as 500 ms.

In the embodiment of FIG. 4, the DC voltage ramp to quadrupole ion trap 402 is provided by DC line 410, and the DC voltage ramp to multipole ion trap 404 is provided by DC line 412, where the DC voltages are controlled by control system 408. These DC voltage lines are connected to the electrodes of their respective ion traps.

Figure 5:
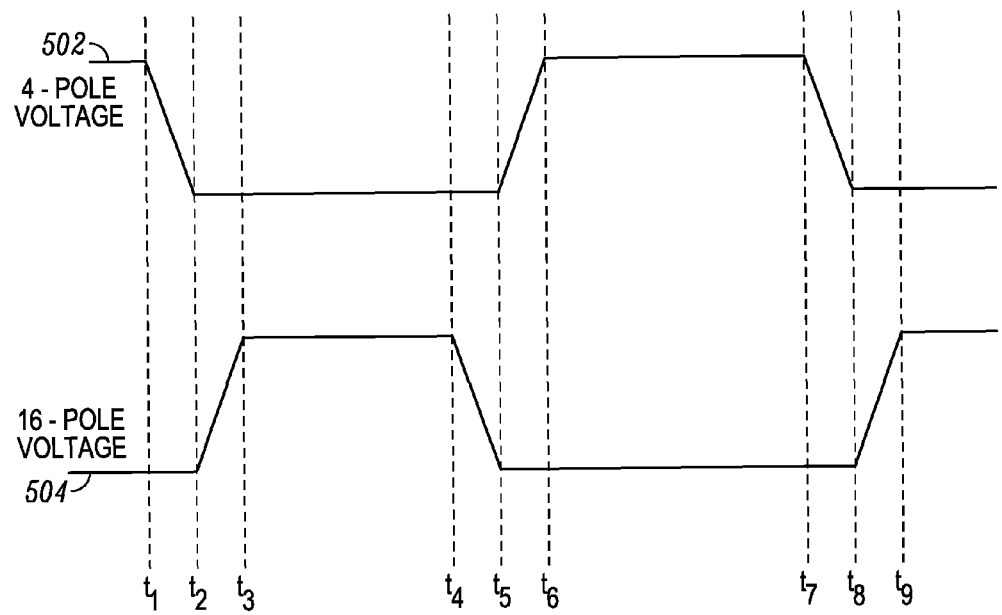
FIG. 5 illustrates voltage waveforms for shuttling ions according to an embodiment.

Typical voltage ramps are illustrated in FIG. 5, where curve 502 represents the voltage ramp for a quadrupole ion trap, and curve 504 represents the voltage ramp for a multipole ion trap, such as for example a 16-POLE ion trap. These curves do not represent actual waveform values, but are meant to illustrate a method of shuttling ions from one ion trap to another.

Referring to FIG. 5, just before time $t_1$, the voltage of the quadrupole ion trap is relatively positive, whereas the voltage of the multipole ion trap is relatively negative, so that the positively charged mercury ions are confined in the multipole ion trap. From time $t_1$ to time $t_2$, the voltage of the quadrupole ion trap is brought from a relatively positive value to a relatively negative value (a negative going transition), followed by bringing the voltage of the multipole ion trap to a relatively positive value at time $t_3$ (a positive going transition). This process shuttles, the ions away from the multipole ion trap and to the quadrupole ion trap.

This process is reversed at times $t_4$, $t_5$, and $t_6$, where at time $t_4$ the voltage of the multipole ion trap is brought from a relatively positive value to a relatively negative value at time $t_5$, and from time $t_5$ to time $t_6$ the voltage of the quadrupole ion trap is brought from a relatively negative value to a relatively positive value. This process shuttles the ions back to the multipole ion trap. The process represented at times $t_7$, $t_8$, and $t_9$ shuttles the ions back to the quadrupole ion trap.

For some embodiments, typical DC voltage swings may be on the order of a few volts, where the voltage ramp time width may be on the order of a few hundred milliseconds.

In addition to the DC voltages, RF voltages for confining the ions in their respective traps are also applied as shown in FIG. 4. RF line 414 provides RF voltages $\pm U_1 \sin \Omega_1 t$ to quadrupole ion trap 402, and RF line 416 provides RF voltages $\pm U_2 \sin \Omega_2 t$ to multipole ion trap 404, were these RF voltages are controlled by control system 408. A ± symbol is used in the description of these RF voltages to indicate that each RF line is actually a pair of RF lines, where the two lines making up a pair are driven in opposite phase. These RF voltage lines are connected to the electrodes of their respective ion traps. For each ion trap, the phase of the RF voltage applied to any one electrode is shifted by $\pi$ radians relative to its nearest neighbor electrodes.

For example, RF line 414 comprises two RF lines, one driven at voltage $U_1 \sin \Omega_1(t+\Phi)$ and the other at voltage $-U_1 \sin \Omega_1(t+\Phi)$, where $\Phi$ is some phase. If an electrode is driven at voltage $U_1 \sin \Omega_1(t+\Phi)$, then its two nearest neighbors are driving at voltage $-U_1 \sin \Omega_1(t+\Phi)$. Similar remarks apply to RF line 416.

In practice, the DC voltage may be superimposed (added) to the RF voltages, so that separate DC lines 410 and 412 are not needed. However, for ease of illustration, separate DC voltage lines are shown.

Figure 6:
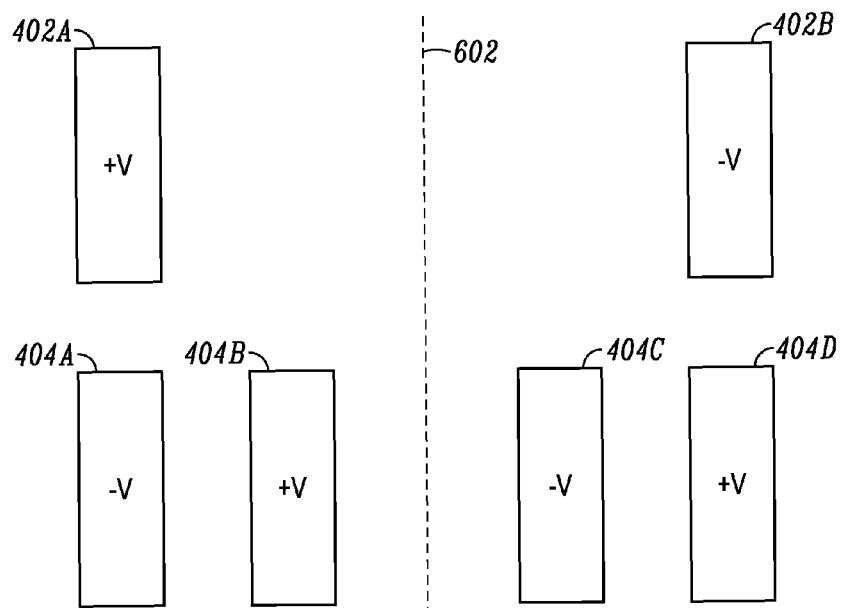
FIG. 6 illustrates the relative electrical phases of electrodes in a first ion trap and a second ion trap according to an embodiment.

For some embodiments, the ion traps are positioned to be co-linear with each other separated by small gap 406. The width of gap 406 should be short relative to the diameter of the electrode rods in the ion traps. For most embodiments, it is expected that each ion trap has its electrodes cylindrically spaced about a longitudinal axis. This is pictorially illustrated in FIG. 6, illustrating electrodes 402A and 402B belonging to quadrupole ion trap 402, and electrodes 404A, 404B, 404C, and 404D belonging to multipole ion trap 404. For simplicity, not all electrodes are shown. In the example of FIG. 6, both ion traps are co-linear with their centered about longitudinal axis 602.

If both ion traps are operated at the same RF frequency for confining the ions (i.e., $\Omega_1=\Omega_2$), then co-aligning a quadrupole ion trap to an arbitrary multipole ion trap may result in holes in the ion confining fields, whereby a "hole" is a region with a well depth of essentially zero where ions may escape and collide with that part of the ion trap structure that surrounds the electrodes. However, for some configurations where at least some of the electrodes of the quadrupole ion trap may be co-aligned with some of the electrodes of the multipole ion trap, these holes may be mitigated by driving such co-aligned electrodes with opposite phase. For example, referring to FIG. 6, the phase of the RF voltage driving electrode 402A is $\pi$ radians out of phase with the RF voltage driving electrode 404A. This is noted by arbitrarily assigning +V to electrode 402A and assigning -V to electrode 404A. In similar fashion, the phase of the RF voltage driving electrode 402B is $\pi$ radians out of phase with the RF voltage driving electrode 404D. Note that for the particular embodiment of FIG. 6, electrodes 402A and 402B are spaced relative to one another so that they are driven in opposite phase.

In general, it may not be feasible to align the electrodes as indicated in FIG. 6 because of the number of electrodes for the multipole ion trap relative to that of the lower order ion trap, which may be a quadruple ion trap for some embodiments. Accordingly, for some embodiments, the frequency of the RF voltage driving the electrodes of the multipole ion trap is not equal to the frequency of the RF voltage driving the electrodes of the lower order ion trap. For example, for some embodiments, the RF frequency driving the multipole ion trap may be higher than that of the lower order ion trap. As one particular example, the frequency for the multipole ion trap may be approximately twice that of the lower order ion trap. That is, for some embodiments, $\Omega_2>\Omega_1$, whereas for some other embodiments, $\Omega_2 \sim 2\Omega_1$. For properly chosen frequencies, it is found that the resulting holes will open and close faster than the time for which the ions may generally drift through, thereby mitigating the effects of the holes.

Various modifications may be made to the described embodiments without departing from the scope of the invention as claimed below.

What is claimed is:

1. An atomic clock comprising:
   (a) a first ion trap including a first number n of first electrodes or poles;
   (b) a second ion trap including a second number m of second electrodes or poles, where m>n, wherein the first ion trap stimulates fluorescence of one or more ions moved between the first ion trap and the second ion trap, the second ion trap interrogates a resonance of the ions, the first electrodes or poles confine the ions in the first ion trap when the first ion trap stimulates the fluorescence, and the second ion trap confines the ions in the second ion trap when the second ion trap interrogates the resonance; and
   (c) a control system coupled to one or more radio frequency lines, wherein the control system and the radio frequency lines apply:
      (i) a first radio frequency voltage to at least one of the first electrodes or poles, to confine the ions in the first ion trap, and
      (ii) a second radio frequency voltage to at least one of the second electrodes or poles, to confine the ions in the second ion trap, wherein the second radio frequency voltage has a different frequency or different phase as compared to a phase and a frequency of the first radio frequency voltage.

2. The atomic clock as set forth in claim 1, wherein the first ion trap and the second ion trap are co-linear with each other.

3. The atomic clock as set forth in claim 1, wherein the first ion trap and the second ion trap are electrically separated from each other by a gap.

4. The atomic clock as set forth in claim 1, wherein the first ion trap is of order 4, such that n=4, and the second ion trap is of order 16, such that m=16.

5. The atomic clock as set forth in claim 1, wherein the control system further applies:
   (iii) a first voltage waveform to the first ion trap, wherein the first voltage waveform has a first high value and a first low value less than the first high value, with negative going transitions from the first high value to the first low value, and with positive going transitions from the first low value to the first high value, and
   (iv) a second voltage waveform to the second ion trap, wherein the second voltage waveform has a second high value and a second low value less than the second high value, with negative going transitions from the second high value to the second low value, and with positive going transitions from the second low value to the second high value.

6. The atomic clock as set forth in claim 5, wherein a negative going transition in the first voltage waveform is immediately followed by a positive going transition in the second voltage waveform.

7. The atomic clock as set forth in claim 6, wherein a negative going transition in the second voltage waveform is immediately followed by a positive going transition in the first voltage waveform.

8. The atomic clock as set forth in claim 1, wherein the second radio frequency voltage has the frequency equal to the frequency of the first radio frequency voltage, and the second radio frequency voltage has the phase $\pi$ radians different from the phase of the first radio frequency voltage.

9. The atomic clock as set forth in claim 1, wherein the frequency of the second radio frequency voltage is higher than the frequency of the first radio frequency voltage.

10. The atomic clock as set forth in claim 1, wherein at least one of the second electrodes is co-linear with at least one of the first electrodes.

11. The atomic clock as set forth in claim 1, further comprising:
- a microwave radiator coupled to the second ion trap; and
- an optical detector to measure fluorescence response and coupled to the first ion trap.

12. The atomic clock as set forth in claim 11, wherein the control system controls shuttling of the ions from the first ion trap to the second ion trap, and controls microwave radiation to the ions when the ions are in the second ion trap to cause a transition from a first energy level to a second energy level higher than the first energy level.

13. The atomic clock as set forth in claim 12, wherein the control system controls irradiation of the ions when in the first ion trap to cause the fluorescence.

14. A method of providing a clock resonance frequency from an atomic clock, comprising:
- confining one or more ions in a first ion trap, wherein the first ion trap includes a first number n of first electrodes or poles, by applying a first radio frequency voltage to the first electrodes or poles;
- stimulating fluorescence of the ions to populate a first energy level;
- moving the ions from the first ion trap to a second ion trap, wherein the second ion trap includes a second number m of second electrodes or poles, where m>n;
- confining the ions in the second ion trap using the second electrodes or poles by applying a second radio frequency voltage, having a different frequency or different phase as compared to the first radio frequency voltage, to the second electrodes or poles; and
- irradiating the ions in the second ion trap with microwave radiation to cause at least some of the ions to transition from the first energy level to a second energy level, wherein a frequency of the microwave radiation is used to obtain the clock resonance frequency.

15. The method of claim 14, wherein a first frequency of the first radio frequency voltage is equal to a second radio frequency of the second radio frequency voltage and the second radio frequency voltage has a second phase that is $\pi$ radians different from a first phase of the first radio frequency voltage.

16. The method of claim 14, wherein a first frequency of the first radio frequency voltage is less than a second radio frequency of the second radio frequency voltage.

17. The method of claim 14, wherein the application of a first frequency of the first radio frequency voltage and a second frequency of the second radio frequency voltage improves confinement of the ions in the second ion trap.

18. An atomic clock comprising:
- a first ion trap, including first electrodes or poles;
- a second ion trap including second electrodes or poles, wherein the first ion trap stimulates fluorescence of one or more ions moved between the first ion trap and the second ion trap, the second ion trap interrogates resonance of the ions, the first electrodes or poles confine the ions in the first ion trap when the first trap stimulates the fluorescence, and the second electrodes or poles confine the ions in the second ion trap when the second ion trap interrogates the resonance; and
- a controller coupled to one or more lines, wherein the controller and the lines apply:
  (i) one or more first electromagnetic fields, having a first frequency, to at least one of the first electrodes or poles to confine the ions in the first ion trap, and
  (ii) one or more second electromagnetic fields, having a second frequency different from the first frequency, to least one of the second electrodes or poles, to confine the ions in the second ion trap.

19. The atomic clock of claim 18, wherein the second frequency is higher than the first frequency.

20. The atomic clock of claim 18, further comprising a first number of the first electrodes or poles and a second number of the second electrodes or poles, wherein the second number is greater than the first number, the first ion trap and the second ion trap are multipole traps that are co-linear with each other, and the first electromagnetic fields and the second electromagnetic fields are one or more radio frequency voltages such that the first frequency and the second frequency are radio frequencies and the ions have improved confinement in the second ion trap.

21. A method of improving confinement of one or more ions in an atomic clock, comprising:
- moving one or more ions between a first ion trap and a second ion trap;
- applying one or more first electromagnetic fields, having a first frequency, to the first ion trap when the ions are in the first ion trap, to confine the ions in the first ion trap; and
- applying one or more second electromagnetic fields, having a second frequency, to the second ion trap when the ions are in the second ion trap, to confine the ions in the second ion trap, wherein the first frequency is different from the second frequency and the application of the first electromagnetic fields and the second electromagnetic fields improves confinement of the ions in the second ion trap.

22. The method of claim 21, wherein a first number of the first electrodes or poles is less than a second number of the second electrodes or poles, the first ion trap and the second ion trap are multipole traps that are co-linear with each other, and the first electromagnetic fields and the second electromagnetic fields are one or more radio frequency voltages such that the first frequency and the second frequency are radio frequencies.

23. The method of claim 22, wherein the second frequency is higher than the first frequency.

* * * * *